United States Patent [19]

Kellam

[11] Patent Number: 5,179,316
[45] Date of Patent: Jan. 12, 1993

[54] ELECTROLUMINESCENT DISPLAY WITH SPACE CHARGE REMOVAL

[75] Inventor: Mark D. Kellam, Chapel Hill, N.C.

[73] Assignee: MCNC, Research Triangle Park, N.C.

[21] Appl. No.: 766,418

[22] Filed: Sep. 26, 1991

[51] Int. Cl.$^5$ ............... H05B 33/14; H01L 33/00
[52] U.S. Cl. ................... 313/499; 313/506; 315/169.3
[58] Field of Search ............ 313/498, 499, 506; 315/169.3; 357/17, 22 C

[56] References Cited

U.S. PATENT DOCUMENTS

| | | | |
|---|---|---|---|
| 3,806,759 | 4/1974 | Kabaservice et al. | 315/71 |
| 4,486,499 | 12/1984 | Morimoto | 428/336 |
| 4,554,485 | 11/1985 | Yamada | 315/169.3 |
| 4,603,280 | 7/1986 | Pankove | 313/509 |
| 4,613,793 | 9/1986 | Panicker et al. | 315/169.3 |
| 4,720,432 | 1/1988 | VanSlyke et al. | 428/457 |
| 4,751,427 | 6/1988 | Barrow et al. | 313/503 |
| 5,107,318 | 4/1992 | Makiuchi et al. | 357/22 C |

OTHER PUBLICATIONS

Evaluation Technology of VLSI Reliability Using Hot Carrier Luminescence, Y. Uraoka et al., IEEE Transactions on Semiconductor Manufacturing, vol. 4, No. 3, Aug. 1991, pp. 183-192.

Primary Examiner—Sandra L. O'Shea
Attorney, Agent, or Firm—Bell, Seltzer, Park & Gibson

[57] ABSTRACT

An electroluminescent display device including a semiconductor substrate having a phosphor layer on one face thereof, and a space charge removing means in the semiconductor substrate. The space charge removing means continuously removes carriers, typically electrons, from the space charge barrier region formed during device operation, to thereby reduce space charge barrier related brightness limitations. The space charge removing means may comprise a doped region in the semiconductor substrate adjacent the phosphor layer, which is DC biased to continuously remove electrons from the space charge region. Alternatively, the doped region in the substrate adjacent the phosphor layer may inject electrons into the phosphor layer, with space charge removal being accomplished by a DC biased substrate contact. The space charge region in the substrate is reduced or eliminated thereby increasing the maximum number of electrons which can be injected into the electroluminescent layer and increasing the brightness of the display device.

21 Claims, 5 Drawing Sheets

ELECTROLUMINESCENT DISPLAY WITH SPACE CHARGE REMOVAL

FIELD OF THE INVENTION

This invention relates to solid state display devices, and more particularly to electroluminescent display devices.

BACKGROUND OF THE INVENTION

The cathode ray tube (CRT) is the predominant display device for electronic systems such as computers and televisions, notwithstanding its many shortcomings. Among these shortcomings are the large spatial volume ("footprint") occupied by a CRT, the high power supply voltages needed for the tube, and the relatively short lifetime of the tube.

In recognition of these shortcomings, the art has heretofore proposed many alternative solid state displays, such as light emitting diodes (LED), liquid crystal displays (LCD), and electroluminescent (EL) displays. However, solid state displays have their own limitations which prevent replacing a CRT for many applications. The present invention is directed to overcoming the performance limitations of electroluminescent displays.

As is well known to those having skill in the art, electroluminescent displays are formed by applying an electric field across an electroluminescent material, typically a phosphor, in sufficient magnitude to cause avalanche breakdown of the phosphor. The light generated by recombination of electron-hole pairs produced by the breakdown can be tuned in wavelength by the addition of various impurity ions to the phosphor. Arrays of electroluminescent elements may be used to create television screens, computer graphic displays and a wide range of other display devices.

Most electroluminescent display devices are two terminal devices, having a pair of electrodes on opposite faces of the electroluminescent layer (phosphor). Often, the phosphor is formed on one face of a semiconductor substrate, so that the semiconductor substrate can act as a carrier injector, typically an electron injector, upon application of an appropriate bias voltage between the exposed face of the phosphor and the exposed face of the semiconductor substrate. Examples of such two-terminal electroluminescent devices may be found in U.S. Pat. Nos. 4,486,499 to Morimoto entitled Electroluminescent Device and 4,720,432 to VanSlyke et al. entitled Electroluminescent Device With Organic Luminescent Medium.

A major limitation which has prevented widespread use of electroluminescent displays is their low intensity or brightness level. This low intensity results from an inherent limitation on the number of carriers, typically electrons, which can be injected into the phosphor from the semiconductor substrate, due to space charge at the interface of the phosphor and semiconductor substrate. In particular, the bias voltage across the semiconductor substrate produces electrons in the substrate, which are accelerated towards the phosphor layer by the bias voltage. Many of the electrons have sufficient energy to overcome the barrier presented by the phosphor layer, and enter the phosphor layer to cause avalanche breakdown and recombination. However, the electrons which do not have sufficient energy to overcome the barrier of the phosphor layer, form a space charge region in the semiconductor substrate. This space charge region forms an additional barrier to penetration by the electrons which are accelerating towards the phosphor layer, so that the number of electrons which are injected into the phosphor becomes self limiting. Since the number of electrons which can overcome the barrier are self limiting, the ultimate intensity which can be produced is also limited.

The art has attempted to overcome the space charge limitation by providing an alternating current (AC) bias across the electroluminescent display. Space charge builds up during, for example, the positive half of the alternating current bias, but decays during, for example, the negative half of the AC bias. See for example, U.S. Pat. Nos. 3,806,759 to Kabaservice et al. entitled Electroluminescent Cell With Integrated Switching Control; 4,603,280 to Pankove entitled Electroluminescent Device Excited by Tunneling Electrons; 4,613,793 to Panicker entitled Light Emission Enhancing Dielectric Layer for EL Panel; and 4,751,427 to Barrow et al. entitled Thin Film Electroluminescent Device. Unfortunately, the need for AC bias complicates the driving circuits of the electroluminescent display, and also limits the total amount of light which can be produced by the electroluminescent device, since light is not produced at least one half of the time. Moreover, during the half of the cycle when light is produced, space charge limitations still exist.

The art has also suggested a three terminal electroluminescent device which adds a "gate" electrode to control or modulate the brightness of the electroluminescent display. See for example, U.S. Pat. No. 4,554,485 to Yamada entitled Solid State Image Display Device. Yamada describes an electroluminescent display including an electron injection region of high impurity density on one face of the semiconductor substrate, and a phosphor region on the opposite face of the semiconductor substrate. The amount of electrons injected into the phosphor is controlled by a drive control region provided in the one face of the semiconductor substrate opposite the phosphor, and aligned between the electron injection region and the phosphor. The drive control region (also called a "gate") controls the amount of carriers injected from the semiconductor substrate by forming a depletion region across the electron injection region. The area of the semiconductor substrate through which electrons can travel is reduced by the depletion region, and the current is thereby reduced.

Although the Yamada device provides brightness control, by using a gate region in the face of the semiconductor substrate opposite the phosphor layer, this device is still susceptible to space charge limitations. During device operation, the face of the semiconductor substrate which lies under the phosphor becomes saturated with low energy electrons. These electrons, which do not have sufficient energy to overcome the phosphor barrier, form a negative space charge region. This negative charge effectively increases the height of the barrier, by repelling electrons that accelerate towards the barrier, leading to a rapid saturation in the current flowing through the phosphor. Since the light output of the device is proportional to the current in the phosphor, the device brightness is limited.

Summary of the Invention

It is therefore an object of the invention to provide an improved electroluminescent display device.

It is another object of the invention to provide an electroluminescent display device having reduced susceptibility to space charge related brightness limitations.

It is yet another object of the invention to provide an electroluminescent device which does not require the use of alternating bias current bias to collapse the space charge region.

These and other objects are provided, according to the invention, by a solid state display device which includes space charge removing means in the semiconductor substrate, for continuously removing carriers, typically electrons, from the space charge barrier region, to thereby reduce space charge barrier related brightness limitations. In particular, the electroluminescent device includes a semiconductor substrate having an electroluminescent layer (e.g. phosphor) on the first face thereof. The semiconductor substrate produces electrons and accelerates the electrons towards the first face upon application of a bias voltage, so that some of the accelerated electrons possess sufficient energy to enter the phosphor layer and produce electroluminescence, and some of the electrons do not have sufficient energy to overcome the phosphor barrier. The semiconductor substrate also includes space charge removing means, for continuously removing electrons which have insufficient energy to enter the phosphor, to thereby reduce, or preferably eliminate, the space charge barrier region at the semiconductor-phosphor interface.

The space charge removing means may comprise a doped region in the semiconductor substrate at the first face, and means for applying a direct current (DC) bias to the doped region. The doped region is oriented relative to the space charge barrier to continuously remove electrons therefrom upon application of the DC bias. The electroluminescent display thereby operates in DC mode with little or no space charge degradation.

A preferred embodiment of the display device of the present invention includes a semiconductor substrate of first conductivity type, having a first face and an electroluminescent layer on the first face. A region of second conductivity type is formed in the semiconductor substrate at the first face, and extends adjacent the electroluminescent layer. The region of second conductivity type may contact the electroluminescent layer, and preferably overlaps the electroluminescent layer at the first face. However, since the semiconductor substrate of first conductivity type and the region of second conductivity type form a semiconductor junction which produces a depletion zone thereat, the region of second conductivity type need only be brought sufficiently close to the electroluminescent layer such that the depletion zone contacts the electroluminescent layer at the first face.

Complementary versions of the display device of the present invention may be fabricated, with a first version including a p type semiconductor substrate and a second version having an n type semiconductor substrate. In the p type substrate version, an electroluminescent layer is formed on the first face of the p type semiconductor substrate. The p type semiconductor substrate accelerates electrons toward the first face upon application of a bias voltage thereto. Some of the accelerated electrons are injected into the electroluminescent layer and some of the accelerated electrons form a space charge region at the first face adjacent the electroluminescent layer. An n type region is provided in the semiconductor substrate at the first face, with the n type region forming a p-n junction with the p type semiconductor region, the p-n junction including the depletion zone thereat. The n type region is formed sufficiently close to the electroluminescent layer so that the depletion zone contacts the space charge region and dissipates the space charge through the n type region. The n type region may directly contact the electroluminescent region and preferably overlaps the electroluminescent region at the first face of the semiconductor substrate. A DC bias is applied to the n type region to thereby continuously dissipate the space charge through the n type region.

In the n type substrate version of the display device, an electroluminescent layer is formed on the first face of an n type semiconductor substrate. A p type region is formed in the semiconductor substrate at the first face. The p type region forms a p-n junction with the n type semiconductor substrate, the p-n junction including a depletion zone thereat. The p type region is sufficiently close to the electroluminescent region so that the depletion zone contacts the electroluminescent layer and injects electrons from the p type region into the electroluminescent layer upon application of a bias voltage between the p type region and the electroluminescent layer. A bias voltage applied to a substrate contact provides space charge dissipation through the substrate contact.

A three terminal electroluminescent device is thereby produced, with a first terminal on the electroluminescent layer, a second terminal on the semiconductor substrate, and a third terminal on the region in the first face of the semiconductor substrate. Application of the appropriate DC bias voltage allows space charge carriers to be continuously swept from the semiconductor substrate, to prevent formation of a barrier which limits injection of carriers into the phosphor. Current limitations of conventional electroluminescent devices are thereby reduced or eliminated, leading to a high intensity electroluminescent device which can compete with cathode ray tube displays.

BRIEF DESCRIPTION OF THE DRAWINGS

FIGS. 2c and 2d illustrate alternative embodiments for the space charge removing region of FIG. 2a.

FIGS. 5a–5d illustrate a sequence of steps for fabricating the device of FIG. 2a.

DESCRIPTION OF A PREFERRED EMBODIMENT

The present invention now will be described more fully hereinafter with reference to the accompanying drawings, in which a preferred embodiment of the invention is shown. This invention may, however, be embodied in many different forms and should not be construed as limited to the embodiment set forth herein; rather, this embodiment is provided so that this disclosure will be thorough and complete, and will fully convey the scope of the invention to those skilled in the art. Like numbers refer to like elements throughout.

Space Charge Effect

Prior to describing operation of the electroluminescent display device of the present invention, the space charge effect and its impact on the performance of known electroluminescent devices will be described. Because the electroluminescent device of U.S. Pat. No. 4,554,485 to Yamada is a three-terminal device, the space charge effect will be described relative to this device. However, it will be understood by those having skill in the art that conventional two-terminal electroluminescent devices also suffer from space charge limitations.

Figure 1A:
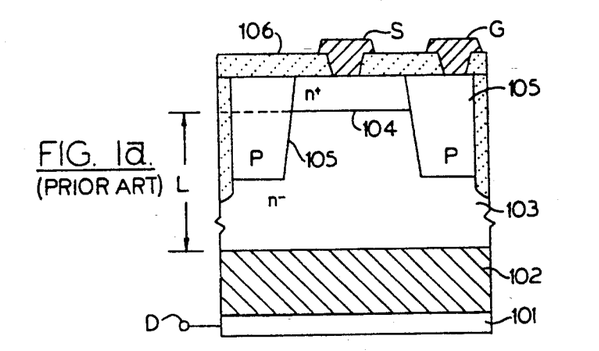
FIGS. 1a 1e illustrate a prior art electroluminescent device.
Figure 1B:
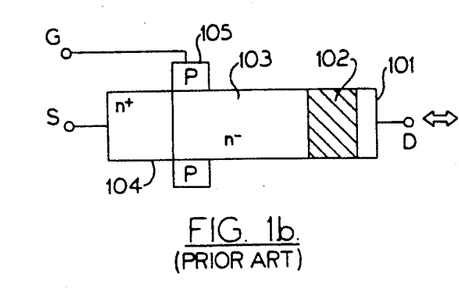
Figure 1C:
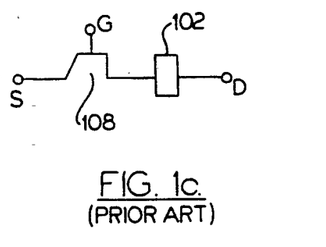

FIGS. 1a–1e correspond to FIGS. 1a–1e of the aforementioned Yamada patent. As shown in FIG. 1a, the electroluminescent device includes an n− semiconductor substrate 103, with a phosphor region 102 formed on a first face thereof. A transparent electrode 101 is formed on the phosphor region. An n+ region 104 is formed in the opposite face of the semiconductor substrate to provide an electron supply source. A p type region 105 is formed in the opposite face of the semiconductor substrate, surrounding the n type region 104. Contacts "S" and "G" for the n+ region 104 and the p regions 105, respectively, are formed in insulating layer 106 on the opposite face of the substrate. FIGS. 1b and 1c show an equivalent circuit and a schematic diagram of the device of FIG. 1a.

Figure 1D:
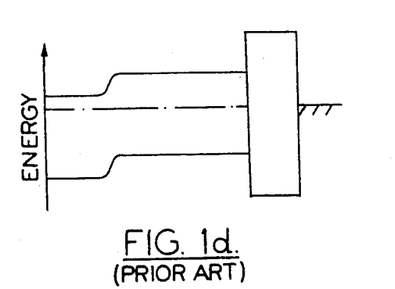
Figure 1E:
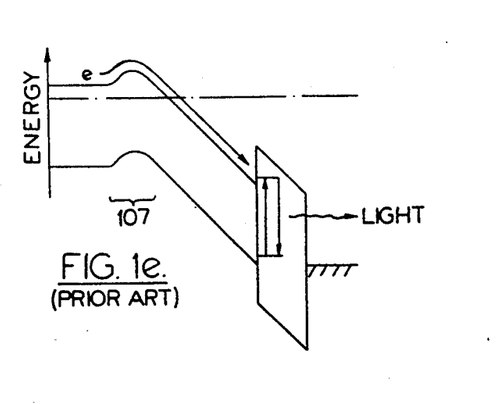

The p type regions 105, on the face of the substrate opposite the electroluminescent layer, modulate the number of electrons being produced by region 104 upon application of an appropriate bias thereto. In particular, application of an appropriate bias to region 105 causes the depletion region surrounding p regions 105 to expand, thereby decreasing the area of the injection region 104 and thereby decreasing the injection current. FIGS. 1d and 1e respectively show an energy band diagram when no voltage is applied to electrode 101, and upon application of a bias voltage to electrode 101.

The above discussion does not describe the effect of space charge, which limits the current which can be injected into the electroluminescent region 102. In particular, during operation, the face of the n− substrate 103 which is adjacent the phosphor region 102, will contain electrons which do not have sufficient energy to cross the barrier into the phosphor, thereby forming a negative space charge region. This negative interface space charge will repel other electrons from entering the phosphor, leading to a rapid saturation of the current flowing through the phosphor. Since the light output of the device is proportional to the current in the phosphor, this space charge becomes a serious limitation to the device brightness.

Figure 1F:
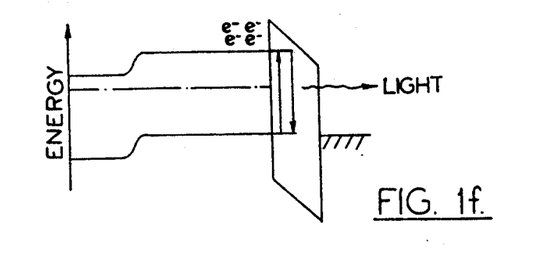
FIG. 1f illustrates an energy band diagram for the prior art electroluminescent device of FIG. 1a, including the effect of space charge.

FIG. 1f, which is not present in the '485 Yamada patent, shows these space charge electrons (e−) at the interface of the phosphor. This band diagram illustrates how the space charge electrons greatly reduce the amount of energy which is applied to the phosphor, thereby reducing the light output. Stated another way, the electric field that accelerates the electrons into the phosphor is made small, because of the effect of the space charge electrons at the interface between the substrate and the phosphor.

ELECTROLUMINESCENT DEVICES OF THE PRESENT INVENTION

Figure 2A:
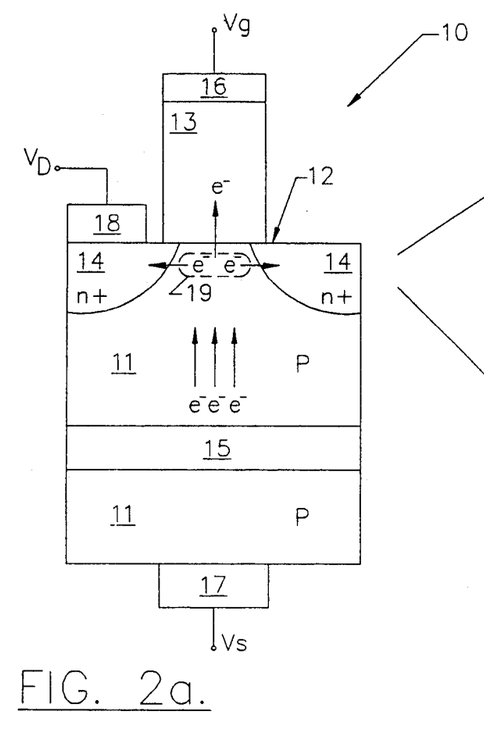
FIGS. 2a and 2b illustrate a cross sectional view and a top view, respectively, of a first embodiment of an electroluminescent display device according to the present invention.
Figure 2B:
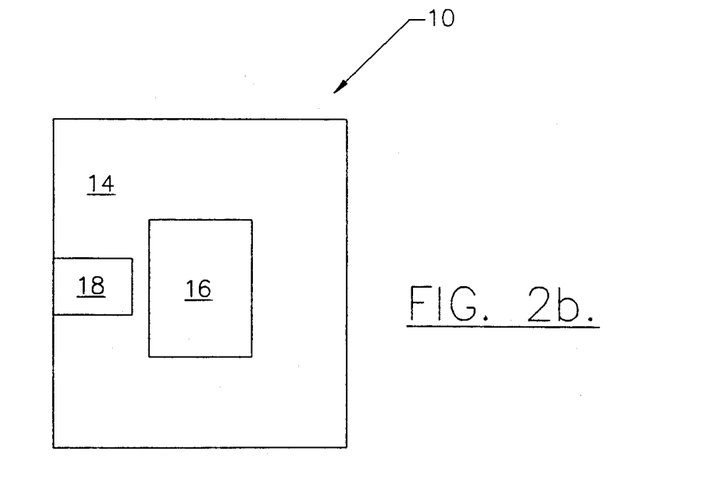

Referring now to FIGS. 2a and 2b, a first embodiment of an electroluminescent display device of the present invention will now be described. As shown in FIG. 2a, electroluminescent device 10 includes a p type semiconductor substrate 11 having a first face 12. An electroluminescent layer 13 is formed on the first face 12. A thin insulating film, such as silicon dioxide, on the order of 100Å or less in thickness, may be present between first face 12 and electroluminescent layer 13. This optional insulating layer is preferably sufficiently thin to allow electrons to be injected through the insulating layer into the phosphor. The optional insulating layer may prevent deleterious interactions between the phosphor and the semiconductor substrate.

An optional buried damage layer 15 may be formed within the semiconductor substrate to facilitate generation of carriers, typically electrons. However, it will be understood by those having skill in the art that other electron generation techniques may be employed. For example, an n type layer may be added in the substrate to provide a p-n junction diode to create free electrons. Alternatively, the inherent impurity doping in the p substrate 11 may, upon application of an appropriate bias voltage, generate free electrons and accelerate the electrons towards phosphor 13, without the need for damage region 15 or p-n junctions in the substrate. Other techniques for generating electrons with in the substrate for injection into an electroluminescent layer, such as thermal and high field avalanching, are well known to those having skill in the art and will not be described further.

Continuing with the description of FIG. 2a, the electroluminescent device 10 also includes a space charge removing region 14 for continuously removing electrons from the space charge region. As shown in FIG. 2a, space charge removing region 14 comprises an n+ region formed in the semiconductor substrate 11 at the first face 12 thereof. Three contacts 16, 17 and 18 may be formed, to contact the electroluminescent region 13, the substrate 11 and the space charge removing region 14, respectively, for application of appropriate bias voltages thereto.

It will be understood by those having skill in the art that the structure of FIG. 2a is not a field effect transistor (FET) but rather is an electroluminescent display device. However, because the cross section of FIG. 2a superficially resembles that of a field effect transistor, the bias voltage applied to contact 16 may be referred to as a gate voltage $V_g$, the bias voltage applied to space charge removing region 14 may be referred to as a drain voltage $V_d$, and the voltage applied to the substrate 11 may be referred to as substrate voltage $V_s$.

As shown in FIG. 2a, upon application of an appropriate DC bias voltage, electrons are generated in substrate 11 and are accelerated towards first face 12. Some of the electrons overcome the barrier of the electroluminescent layer 13 and cause avalanche recombination therein to generate light. However, many of the electrons do not have sufficient energy to overcome the barrier, and form a space charge region 19 at the face 12 under the electroluminescent layer 13. According to the invention, upon application of an appropriate DC bias $V_D$, space charge removing regions 14 absorb at least some of the electrons in the space charge region 19 to thereby reduce, and preferably eliminate the space charge region. The injection barrier is thereby reduced and preferably eliminated. Larger numbers of electrons may thereby be injected into the electroluminescent layer 13, and the attainable brightness increases from that which was heretofore available.

FIG. 2b illustrates the top view of the structure of FIG. 2a. As shown, electroluminescent layer 13 (and contact 16) may be rectangular, with space charge removing region 14 surrounding electroluminescent region 13. Because region 14 is degenerately doped n+, a small contact 18 may be used to form an ohmic contact with the entire layer. Alternatively, a larger portion of region 14 may be metallized to form a contact. Other geometries for these regions will be well understood by those having skill in the art and need not be described herein further.

Figure 2C:
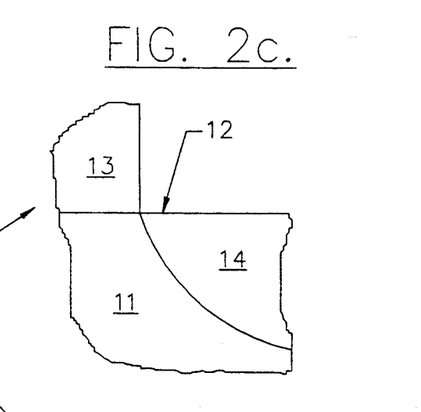
Figure 2D:
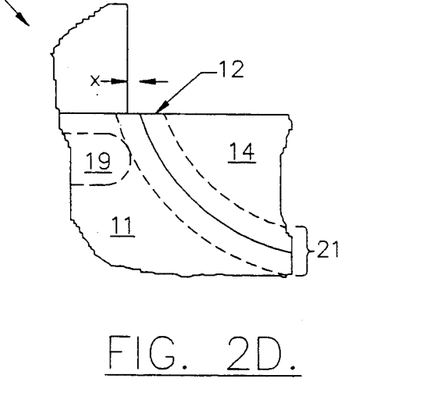

In order to function as a space charge removing region, n+ region must be adjacent the electroluminescent layer 13. As shown in FIG. 2a, region 14 preferably overlaps electroluminescent layer 13. However, as shown in FIG. 2c, region 14 may simply contact electroluminescent layer 13 without overlap. In fact, the region 14 need not actually contact electroluminescent layer 13. As shown in FIG. 2d, since regions 14 and 11 form a p-n junction, which forms a depletion Zone 21 at the junction, region 14 need only be positioned such that it is sufficiently close for the depletion zone 21 to contact the space charge region 19, and thereby form a continuous depletion region which absorbs electrons in the space charge region. In order to ensure that the depletion zone 21 electrically contacts the space charge region 19, the distance X, from the edge of phosphor 13 to the edge of region 14, is preferably less than about 100Å. Region 14 may also be buried in face 12, preferably by less than about 50Å. However, it will be understood by those having skill in the art that since the maximum allowable distances are so small, some overlap will typically be required (as shown in FIG. 2a), in order to compensate for manufacturing alignment tolerances between phosphor 13 and region 14.

Operation of the device of FIGS. 2a–2d will now be described. Operation in two modes will be described: first, when the electroluminescent device is not emitting light (it is turned off) and then when the electroluminescent device is producing light (it is turned on).

Figures 3A, 3B:
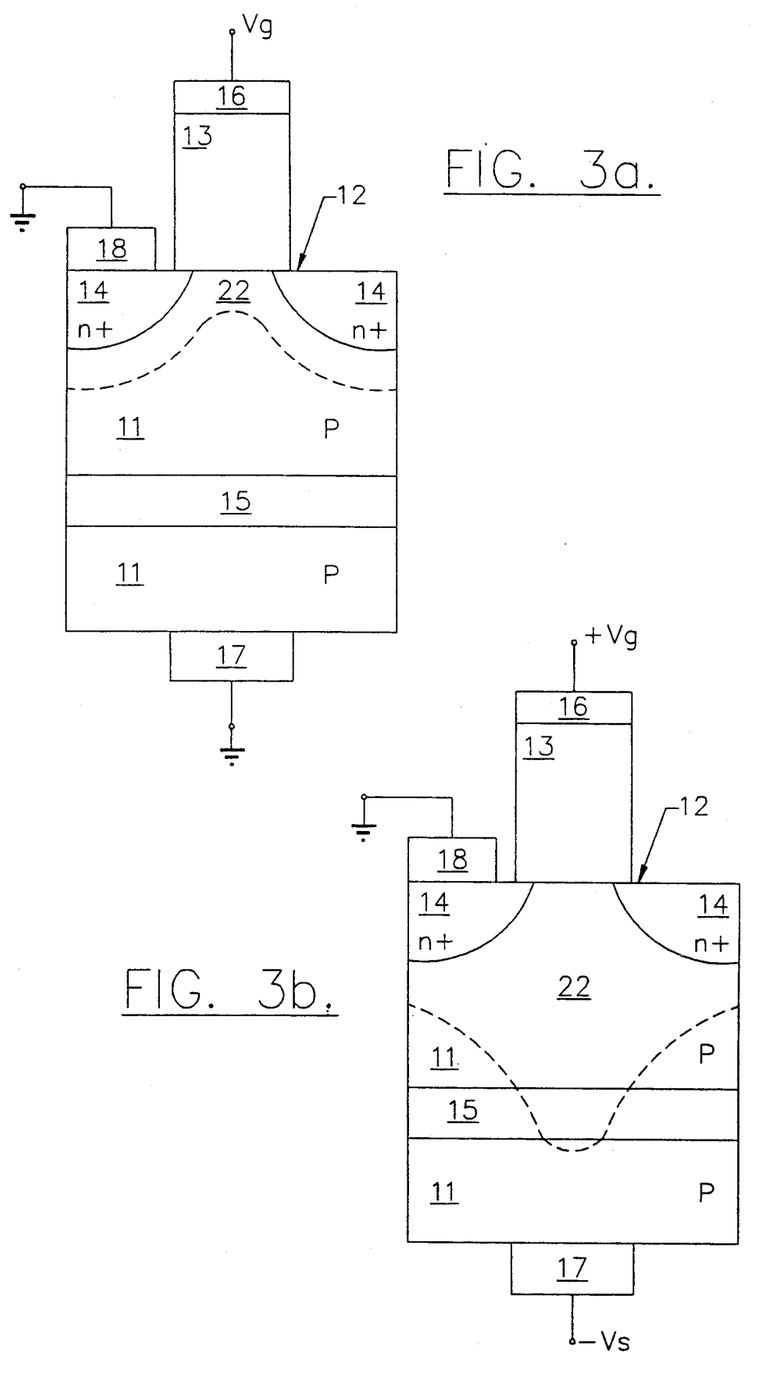
FIGS. 3a and 3b illustrate operation of the device of FIG. 2a when turned off, and when turned on, respectively.

As shown in FIG. 3a, when turned off, a positive voltage $V_g$ is applied to the "gate" electrode 16, and the substrate electrode 17 and the drain electrode 18 are grounded ($V_D = V_S = 0$). The magnitude of the gate voltage should be sufficiently high to maintain an electric field in the phosphor which produces a reasonably high avalanche multiplication factor, but not high enough to cause significant field ionization within the phosphor. Under these conditions, an inversion region 22 will form at the face 12 of the silicon substrate, but the silicon bulk electric field will be too small to create hot electron carriers. Without an injection source of electrons there is no avalanche in the phosphor and no light is emitted from the device.

Referring to FIG. 3b, in order to turn the device on, the drain voltage $V_d$ is maintained at ground voltage and a negative voltage $-V_S$ is applied to the substrate contact 17. Isolated substrate regions (for example using p well isolation), each with its own substrate contact, may also be provided, to independently control the electroluminescent devices. The negative voltage on the substrate contact increases the depth of the depletion region 22 in the substrate 11, and increases the magnitude of the bulk silicon electric field. As the depletion region 22 grows to overlap the subsurface damage region 15, a significant leakage current will be generated in the substrate. These carriers, which are created by Shockley-Hall-Read generation, will be accelerated by the electric field in depletion region 22. Some of the electrons approaching face 12 will have gained enough energy to surmount or tunnel through the surface barrier into the phosphor. These injected carriers will seed the avalanche phenomena within the phosphor and will lead to the emission of light.

The heavily doped regions 14 surrounding the phosphor 13 act as collectors for electrons that have not been injected into the phosphor 13. This prevents buildup of a space charge region 19 (FIG. 2a) which would cancel the silicon substrate electric field and substantially halt the injection process. Regions 14 allow creation of a carrier depleted region beneath the phosphor 13, that will support a high value for the accelerating electric field.

It will be understood by those having skill in the art that the specific voltages described above need not be used. In order to activate the electroluminescent device, the drain voltage $V_d$ is preferably more positive than the substrate voltage $V_s$, and the gate voltage $V_g$ is preferably more positive than the drain voltage $V_d$. The gate voltage should preferably not be so high as to produce a breakdown of the phosphor. Similarly, the substrate voltage is preferably sufficiently lower than the drain voltage, to inject electrons over the phosphor barrier. There is also typically an upper limit on the increase in the electric field in the silicon substrate which the silicon substrate will support, so that too large a value does not typically increase the amount of electrons generated. The control voltage may also be applied to the drain contact, with the substrate grounded.

It will also be understood by those having skill in the art that since the space charge removing region 14 absorbs electrons, significant current will flow through the drain electrode 18. This contrasts with known three terminal electroluminescent devices, such as that described in the aforementioned Yamada patent, in which the gate electrode "G" does not carry significant current because it is simply used to variably deplete the n− region 105, and not as a space charge drain. Since significant current flows through the drain electrode 18 of the present invention, independent control of the electric field in the phosphor 13 and in the substrate 11 may also be obtained. Thus, the phosphor field may be reduced while maintaining high current injection level in the substrate. This improves the phosphor brightness-lifetime tradeoff, and may allow the use of phosphors which were previously excluded from electroluminescent applications.

Figure 4A:
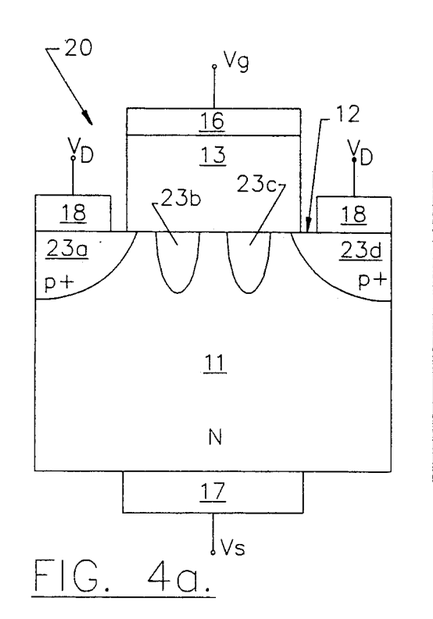
FIGS. 4a–4d illustrate cross sectional and top views of a second embodiment of an electroluminescent display device according to the present invention.
Figure 4B:
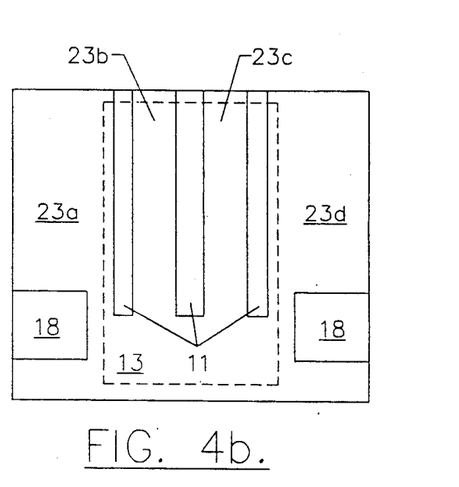

Referring now to FIGS. 4a–4d, an alternative embodiment of the electroluminescent device of the present invention will now be described. As shown in FIGS. 4a and 4b, the conductivities of the regions have been reversed from that of FIGS. 3a–3b, with the substrate 11 being n type and the "drain" region 23 being p type. Application of an appropriate negative bias $V_d$ to drain contact 18 provides injection of electrons into electroluminescent layer 13. Electrons are injected into electroluminescent layer 13 along the boundary (periphery) of injection region 23. In order to enhance the perimeter area, region 23 is preferably formed using a plurality of fingers. Four fingers 23a-23d are shown in FIGS. 4a and 4b. Other perimeter enhancing patterns, such as checkerboard patterns, may also be provided.

Figure 4C:
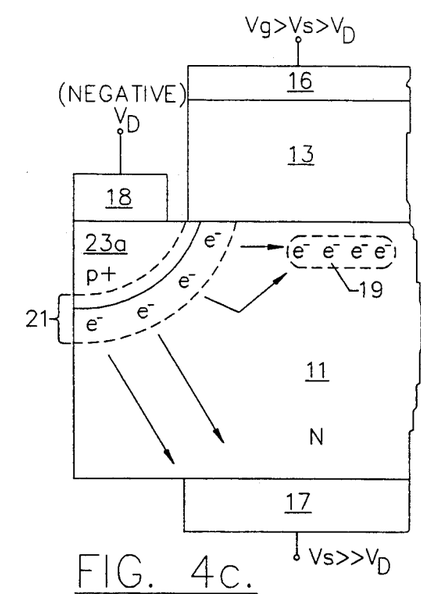
Figure 4D:
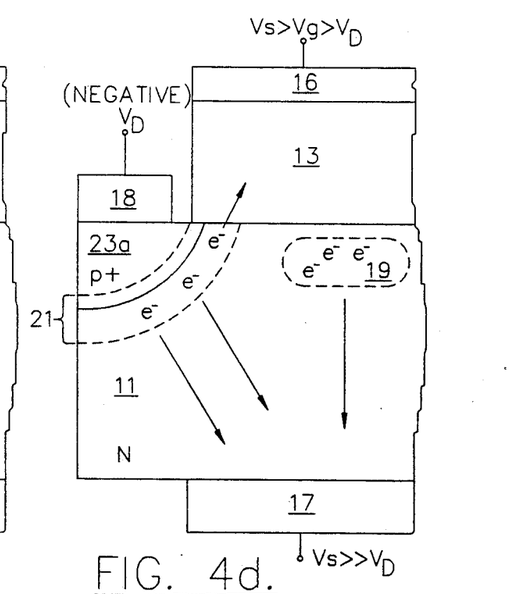

FIGS. 4c and 4d illustrate the leftmost portion of FIG. 4a in greater detail. As shown in FIG. 4c, most of the avalanche electrons formed in the substrate 11 are not injected into electroluminescent layer 13 and form a space charge region 19, when $V_g > V_s > V_D$ and $V_s > > V_D$. However, as shown in FIG. 4d, application of an appropriate substrate bias $V_s$ at substrate contact 17, such that $V_s > > V_D$ and $V_s > V_g > V_D$, causes the substrate 11 itself to remove the space charge 19 through the substrate contact. Without space charge absorption through contact 17, the substrate 11 would rapidly fill with space charge, thereby preventing current from being injected into phosphor 13, as shown in FIG. 4c. With the substrate 11 acting as a space charge removing region, drain 23 allows injection of electrons into the phosphor layer, as shown in FIG. 4d.

The biasing of the gate should be sufficiently high to attract electrons from the drain region, but not from the bulk substrate region. As shown in FIGS. 4c-4d, the gate should have a less attractive potential than the substrate for the electrons generated within the depletion region. If the gate is more attractive, a space charge will form that reduces the gate injection and the light output (FIG. 4c). However, if the gate is less attractive, electrons can be injected into the gate after acceleration across the depletion region, by scattering into the direction of the first face of the substrate (FIG. 4d). Accordingly, although the roles of the substrate and drain have been reversed compared to FIG. 3a, the overall operation of the two devices is similar.

As shown in FIG. 4a, regions 23 preferably overlap the electroluminescent region 13 at the first face 12. However, as shown in FIGS. 2c and 2d, the region 23 may only contact electroluminescent region 13 and may even be slightly spaced from the region 13, with the depletion zone 21 providing a path for injection of electrons into electroluminescent layer 13.

When the device of FIG. 4a is turned off, a positive gate voltage may be applied to contact 16 and contacts 18 and 17 may be grounded as already described. In order to turn the device on, a voltage, sufficiently negative with respect to substrate voltage 17, may be applied to the drain, to thereby create drain avalanche of the p-n junction formed by the substrate 11 and region 23.

It Will be understood by those having skill in the art that the electroluminescent devices of the present invention may be fabricated to inject holes instead of electrons, for example by reversing the conductivity types and the signs of the applied voltages from those described. Since hole injection typically has a lower efficiency than electron injection due to the larger effective mass of the hole in the substrate for many semiconductor materials, hole injection is not preferred for many semiconductor materials. However, where hole injection is preferred, the space charge considerations described above continue to apply, and the present invention overcomes space charge limitations as already described. Accordingly, all references herein to "electrons" will be understood to mean "carriers", i.e. electrons or holes.

Device Fabrication

Referring now to FIGS. 5a-5d, a sequence of steps for fabricating the device of FIG. 2a will be described. Of course, many other fabrication processes will be known to those having skill in the art. The device of FIG. 4a may be fabricated using similar steps.

Figure 5A:
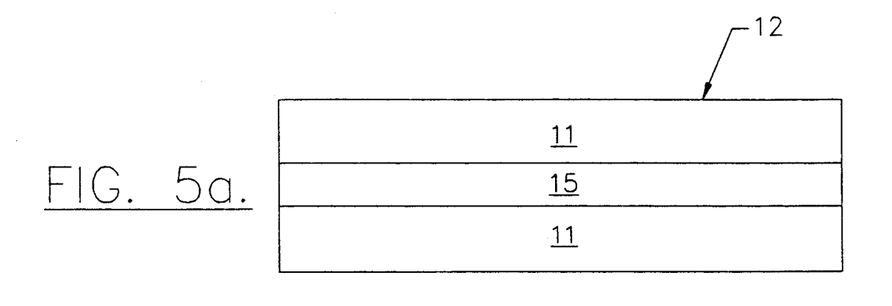

Referring now to FIG. 5a, a p type silicon substrate 11 with relatively high doping (for example approximately 5e17 cm$^{-2}$) is fabricated. Optional buried damage layer 15 may be fabricated approximately 100nm below the first face 12. Layer 15 may be fabricated by preamorphization and rapid regrowth, by implantation of a suitable impurity at the desired depth, or by other techniques well known to those having skill in the art. As already described, the purpose of the buried damage region 15 is to create a large leakage current, where necessary, by Shockley-Hall-Read generation when the damaged region is included in a carrier depleted region formed under the substrate surface.

Figure 5B:
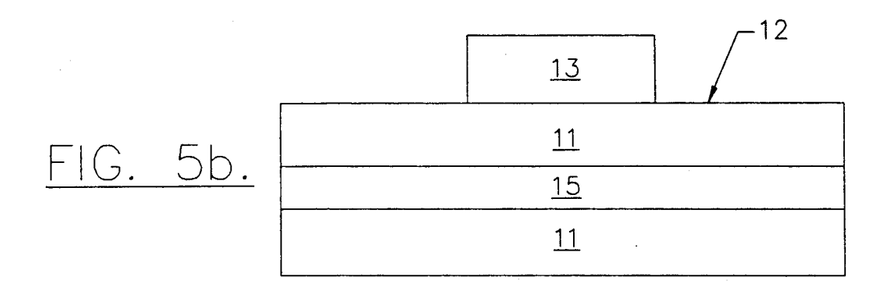
Figure 5C:
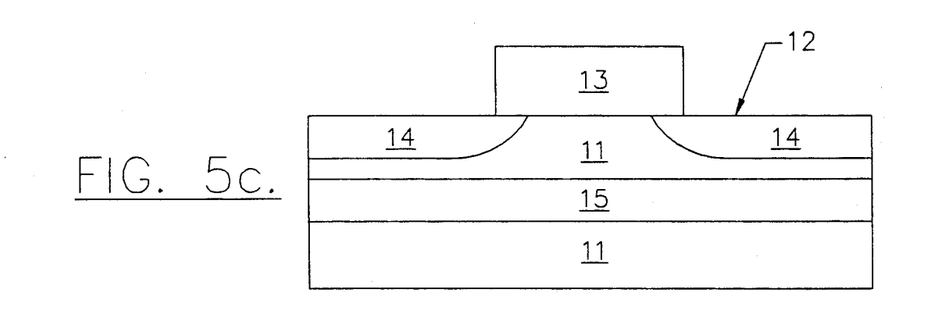

Referring now to FIG. 5b, an electroluminescent material such as a phosphor 13 is deposited on the face 12 by sputtering or other known techniques, and patterned by standard microlithography and etching techniques. Before depositing the phosphor, a thin insulating film (such as silicon dioxide) may be formed on face 12. Referring to FIG. 5c, region 14 is formed by a high dose n type implant, using the phosphor layer 13 as a mask. The implant may be annealed to activate the dopant and to spread the dopant under the phosphor layer 13. A p type punchthrough implant (not shown), aligned to the phosphor layer, may be used to prevent leakage below the n+ regions 14.

Alternatively, still referring to FIG. 5c, region 14 may be formed using a conventional mask, and the regions 14 may then be activated. Then the phosphor layer 13 may be patterned on top of the substrate, using a conventional mask. This alternative fabrication sequence avoids high temperature annealing of the phosphor layer, at the expense of requiring separate masking steps. The non-self-aligned regions 14 must underlap the phosphor 13 sufficiently to ensure overlap (or adjacency) under worst case misalignment conditions.

Figure 5D:
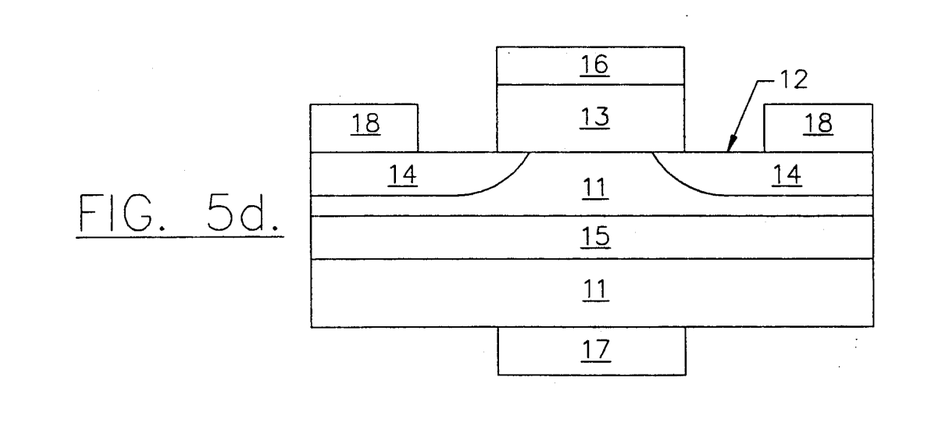

Finally, referring to FIG. 5d, conductors 16, 17 and 18 are patterned to make electrical contact to the phosphor 13, substrate 17 and drain 14, respectively. Electrode 16 is preferably made of a transparent or semitransparent material to allow illumination therethrough, using materials well known to those having skill in the art. The devices so fabricated operate with reduced space charge effects, thereby increasing the number of electrons injected into the phosphor region and increasing the brightness of the electroluminescent display.

In the drawings and specification, there have been disclosed typical preferred embodiments of the invention and, although specific terms are employed, they are used in a generic and descriptive sense only and not for purposes of limitation, the scope of the invention being set forth in the following claims.

That which is claimed:

1. A solid state display device comprising:
   a semiconductor substrate of first conductivity type, having a first face;
   an electroluminescent layer on said first face; and
   a region of second conductivity type in said semiconductor substrate, at said first face, and extending adjacent said electroluminescent layer.

2. The display device of claim 1 wherein said region of second conductivity type contacts said electroluminescent layer at said first face.

3. The display device of claim 1 wherein said region of second conductivity type contacts and overlaps said electroluminescent layer at said first face.

4. The display device of claim 1 further including means for electrically biasing said semiconductor substrate, said electroluminescent layer and said region relative to one another, such that carriers in said semiconductor substrate at said first face are removed from said semiconductor substrate through said region.

5. The display device of claim 1 further comprising means for electrically biasing said semiconductor substrate, said electroluminescent layer and said region relative to one another such that said region injects carriers into said electroluminescent layer, and carriers in said semiconductor substrate are removed from said semiconductor substrate through said semiconductor substrate biasing means.

6. The display device of claim 1 wherein said region and said semiconductor substrate form a semiconductor junction having a depletion zone thereat, and wherein said region is sufficiently close to said electroluminescent layer such that said depletion zone contacts said electroluminescent layer at said first face.

7. A solid state display device comprising:
a p type semiconductor substrate having a first face;
an electroluminescent layer on said first face, said p type semiconductor substrate accelerating carriers towards said first face upon application of a bias voltage thereto, such that some of the accelerated carriers are injected into said electroluminescent layer and some of the accelerated carriers form a space charge region at said first face adjacent said electroluminescent layer; and
an n type region in said p type semiconductor substrate at said first face, said n type region forming a p-n junction with said p type semiconductor substrate, said p-n junction including a depletion zone thereat, said n type region being sufficiently close to said electroluminescent layer such that said depletion zone electrically contacts said space charge region, and removes carriers from the space charge region through said n type region.

8. The display device of claim 7 wherein said n type region contacts said electroluminescent layer at said first face.

9. The display device of claim 7 wherein said n type region contacts and overlaps said electroluminescent layer at said first face.

10. The display device of claim 7 further including means for electrically biasing said p type semiconductor substrate, said electroluminescent layer and said n type region relative to one another, such that carriers in said p type semiconductor substrate at said first face are removed from said p type semiconductor substrate through said n type region.

11. The display device of claim 7 wherein said n type region is sufficiently close to said electroluminescent layer such that said depletion zone contacts said electroluminescent layer at said first face.

12. The display device of claim 7 wherein said p type semiconductor substrate includes a buried damage layer therein.

13. A solid state display device comprising:
an n type semiconductor substrate having a first face;
an electroluminescent layer on said first face; and
a p type region in said n type semiconductor substrate at said first face, said p type region forming a p-n junction with said n type semiconductor substrate, said p-n junction including a depletion zone thereat, said p type region being sufficiently close to said electroluminescent region such that said depletion zone electrically contacts said electroluminescent layer and injects carriers from said p type region into said electroluminescent layer upon application of a bias voltage between said p type region and said electroluminescent layer.

14. The display device of claim 13 wherein said p type region contacts said electroluminescent layer at said first face.

15. The display device of claim 13 wherein said p type region contacts and overlaps said electroluminescent layer at said first face.

16. The display device of claim 13 further comprising means for electrically biasing said n type semiconductor substrate, said electroluminescent layer and said p type region relative to one another such that said p type region injects carriers into said electroluminescent layer, and carriers in said n type semiconductor substrate are removed from said n type semiconductor substrate through said n type semiconductor substrate biasing means.

17. The display device of claim 13 wherein said p type region is sufficiently close to said electroluminescent layer such that said depletion zone contacts said electroluminescent layer at said first face.

18. The display device of claim 13 wherein said p type regions comprises a plurality of fingers in said n type semiconductor substrate at said first face, to thereby enhance injection of carriers from said fingers into said electroluminescent layer.

19. A solid state display device comprising:
an electroluminescent layer having a first face; and
a semiconductor substrate on said first face, said semiconductor substrate comprising:
carrier producing means, for accelerating carriers towards said first face upon application of a bias voltage thereto, such that some of the accelerated carriers are injected into said electroluminescent layer to produce electroluminescence, and some of the accelerated carriers form a space charge barrier in said semiconductor substrate which limits injection of carriers into said electroluminescent layer: and
space charge removing means, for continuously removing carriers from the space charge barrier to increase carrier injection into said electroluminescent layer.

20. The display device of claim 19 wherein said space charge removing means comprises a doped region in said semiconductor substrate, and means for applying a direct current bias to said doped region, said doped region being oriented relative to said space charge barrier to continuously remove carriers therefrom upon application of said direct current bias thereto.

21. The display device of claim 19:
wherein said carrier producing means comprises a doped region in said semiconductor substrate, and means for applying a first direct current bias to said doped region, said doped region being oriented relative to said electroluminescent layer to continuously inject carriers into said electroluminescent layer upon application of said first direct current bias thereto; and
wherein said space charge removing means comprises means for applying a second direct current bias to said semiconductor substrate, to continuously remove carriers therefrom upon application of said second direct current bias thereto.

* * * * *